(12) United States Patent
Tsironis

(10) Patent No.: US 9,344,061 B1
(45) Date of Patent: May 17, 2016

(54) LOW FREQUENCY COAXIAL CAPACITORS AND TUNERS

(71) Applicant: Christos Tsironis, Kirkland (CA)

(72) Inventor: Christos Tsironis, Kirkland (CA)

(*) Notice: Subject to any disclaimer, the term of this patent is extended or adjusted under 35 U.S.C. 154(b) by 20 days.

(21) Appl. No.: 14/454,006

(22) Filed: Aug. 7, 2014

Related U.S. Application Data

(60) Provisional application No. 61/863,615, filed on Aug. 8, 2013.

(51) Int. Cl.
| | |
|---|---|
| *H03H 7/38* | (2006.01) |
| *H03J 3/20* | (2006.01) |
| *H03J 1/06* | (2006.01) |
| *H01G 5/16* | (2006.01) |
| *H01G 5/013* | (2006.01) |
| *H03H 7/40* | (2006.01) |
| *H01G 5/12* | (2006.01) |

(52) U.S. Cl.
CPC ............... *H03J 3/20* (2013.01); *H01G 5/0132* (2013.01); *H01G 5/12* (2013.01); *H01G 5/16* (2013.01); *H03H 7/40* (2013.01); *H03J 1/06* (2013.01)

(58) Field of Classification Search
CPC ......... H01G 5/01; H01G 5/011; H01G 5/019; H01G 5/04; H01G 5/10; H01G 5/12; H03H 7/40

USPC ............. 333/17.3, 263, 32, 33; 361/277, 278, 361/280, 281, 283.2, 287, 289, 290, 297
See application file for complete search history.

(56) References Cited

U.S. PATENT DOCUMENTS

| | | | |
|---|---|---|---|
| 6,674,293 B1 | 1/2004 | Tsironis | |
| 6,975,499 B2 | 12/2005 | Takahashi | |
| 7,242,570 B2 * | 7/2007 | Takahashi | ................ H01G 5/38 361/278 |
| 7,646,268 B1 | 1/2010 | Tsironis | |

* cited by examiner

*Primary Examiner* — Stephen E Jones

(57) ABSTRACT

A new type of variable coaxial, low frequency capacitor uses two cylindrical blocks, which are interdigitally insertable into each-other to create an adjustable capacitance. Each block is made using a conductive (aluminum, brass or copper) strip which is mounted vertically on a conductive basis and is wound in spiral form around a center axis. The blocks are guided coaxially into each-other and the relative orientation angle allows approaching the surfaces of the conductive strips from a maximum distance, which is half the width of the spiral gap, to full galvanic contact. The block penetration is motor controlled and a cascade of three or four such capacitors and associated lengths of coaxial cable is used to make wideband impedance tuners operating in the low MHz frequency range.

16 Claims, 21 Drawing Sheets

FIGURE 1: Prior art

Low frequency remotely controlled electro-mechanical impedance tuner using three variable capacitors.

FIGURE 2: Prior art

Tunable impedances of segmented low frequency tuner for a distance between capacitor blocks equal to optimum λ/6

FIGURE 3: Prior art

Prior Art: Remotely controlled variable capacitor using a
conductive ground block and vertically insertable conductive stubs.

FIGURE 4: Prior art

Prior Art: Remotely controlled variable capacitor using an array of parallel plates FIGURE 5: Prior art FIGURE 6: Prior art FIGURE 17: prior art

LOW FREQUENCY COAXIAL CAPACITORS AND TUNERS

PRIORITY CLAIM

This application claims priority on provisional application 61/863,615 filed on Aug. 8, 2013 titled "Low Frequency Coaxial Capacitors and Tuners".

CROSS-REFERENCE TO RELATED ARTICLES

[1] Load pull measurements: http://en.wikipedia.org/wiki/Load_pull
[2] Product Note 41: Computer Controlled Microwave Tuner—CCMT; Focus Microwaves January 1998.
[3] Standing wave ratio, VSWR: https://en.wikipedia.org/wiki/Standing_wave_ratio
[4] Tsironis, U.S. Pat. No. 7,646,268: Low frequency harmonic load pull tuner and method
[5] Takahashi, U.S. Pat. No. 6,975,499: Vacuum variable capacitor with energization and heat shielding bellows
[6] Tsirnois, U.S. Pat. No. 6,674,293: Adaptable pre-matched tuner system and method
[7] Dielectric constant of various fluids: http://www.engineeringtoolbox.com/liquid-dielectric-constants-d_1263.html
[8] Corona breakdown: Dielectric strength of air: http://hypertextbook.com/facts/2000/AliceHong.shtml

BACKGROUND OF THE INVENTION, PRIOR ART

This invention relates to components used in RF load and source pull testing of medium and high power RF transistors and amplifiers such as remotely controlled electro-mechanical impedance tuners.

Modern design of high power RF amplifiers and mixers, used in various communication systems, requires accurate knowledge of the active device's (microwave transistor's) characteristics. In such circuits, it is insufficient for the transistors, which operate in their highly non-linear regime, close to power saturation, to be described using non-linear numeric models.

A popular method for testing and characterizing such microwave components (transistors) in the non-linear region of operation is "load pull". Load pull is a measurement technique employing microwave tuners and other microwave test equipment (FIG. 1). The microwave tuners (2), (4) are used in order to manipulate the microwave impedance conditions under which the Device Under Test (DUT, or transistor, (3)) is tested, see ref. 1; this document refers hence to "impedance tuners", see ref. 2, in order to make a clear distinction to "tuned receivers (radios)", popularly called elsewhere also "tuners" because of the included tuning circuits.

Impedance tuners for frequencies in the MHz frequency range consist, in general, of a number of tuning blocks each comprising a variable capacitor and a length of transmission line, see ref. 4, (FIG. 2). This cascade of tunable networks allows creating adjustable reflection factors (impedances) over a certain frequency range (FIG. 3), starting as low as 10 MHz, or even lower, and up to 200 MHz, all depending on the capacitance values, the self-resonance of the capacitors (FIGS. 4 to 7) and the choice of cable lengths between capacitors (FIG. 2). The relation between reflection factor and impedance is given by GAMMA=|GAMMA|*exp(jΦ)=(Z−Zo)/(Z+Zo) {1}, wherein Z is the complex impedance Z=R+jX and Zo is the characteristic impedance. A typical value used for Zo is Zo=50 Ohm (see ref. 3). The equivalent is the Voltage Standing Wave Ratio: VSWR=(1+|GAMMA|)/(1−|GAMMA|) {2}.

Prior art MHz range variable capacitor structures are shown in FIGS. 4 to 7. They invariably comprise either parallel plate or coaxial structures. This invention discloses a new variable capacitor structure, based on a spiral layout, which is easier to manufacture and which has a simple capacity of adjusting the maximum capacitance limitation and the parasitic self-resonant frequency.

BRIEF DESCRIPTION OF THE SEVERAL VIEWS OF THE DRAWINGS

The invention and its mode of operation will be more clearly understood from the following detailed description when read with the appended drawings in which.

DETAILED DESCRIPTION OF THE INVENTION

Figure 8:
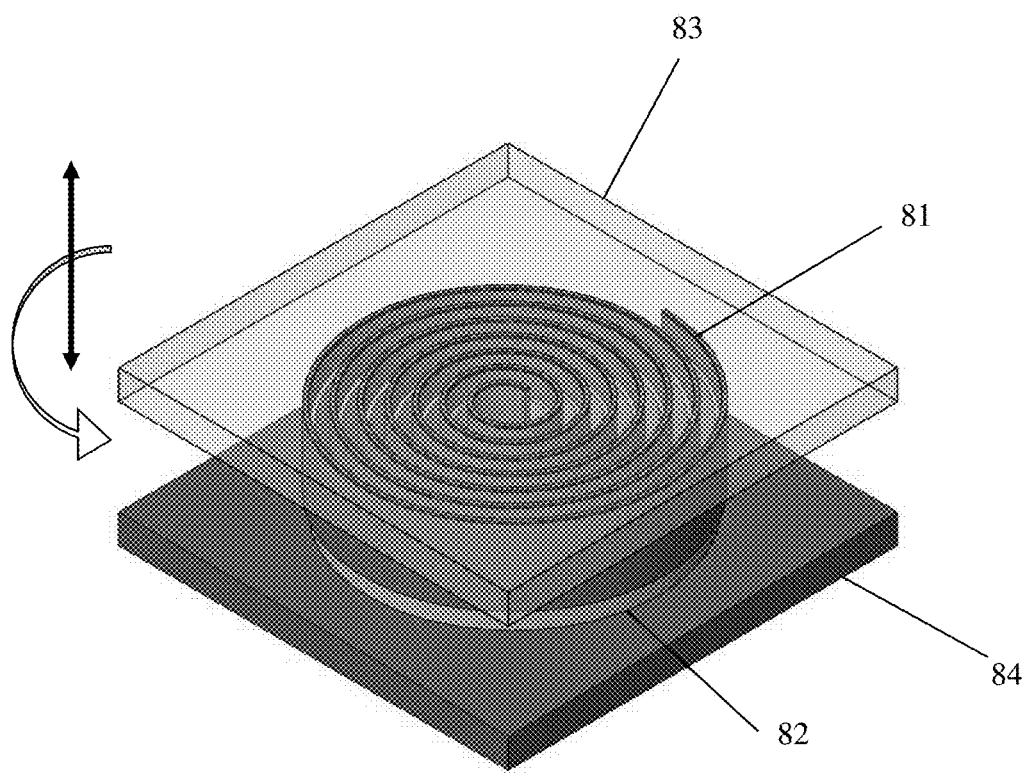
FIG. 8 depicts a perspective view of an adjustable spiral capacitor.
Figure 9:
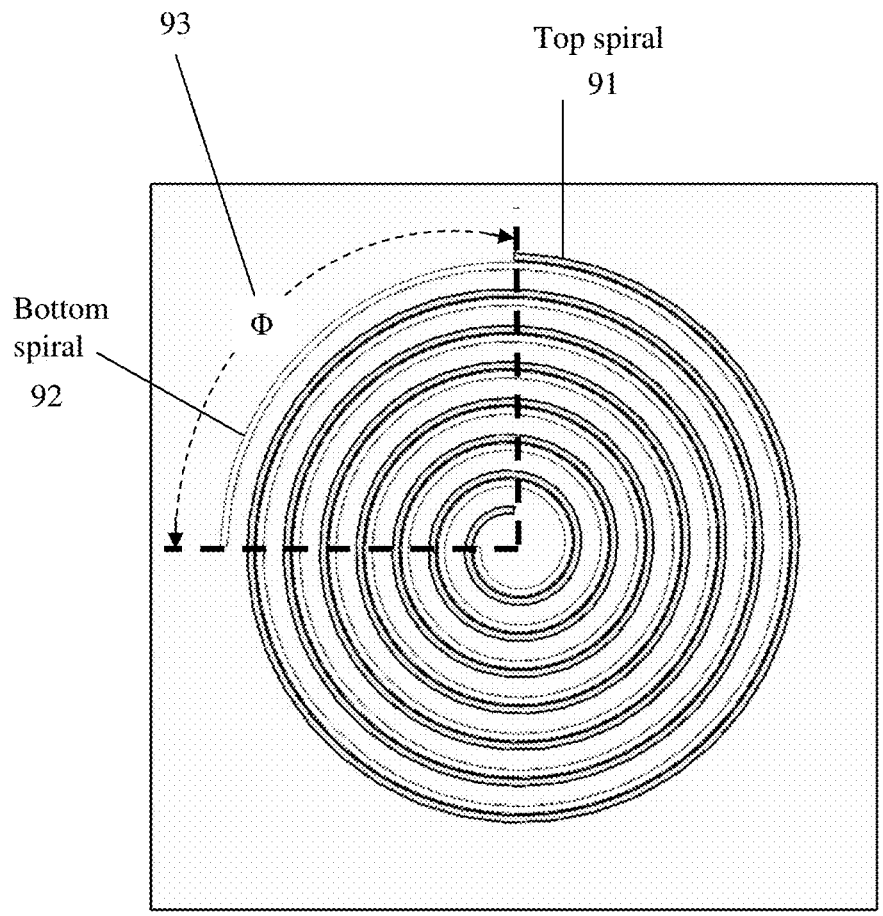
FIG. 9 depicts a horizontal cross section of a spiral capacitor with an axial offset angle close to 90 degrees, whereby the capacitor plates quasi touch each-other.
Figure 10:
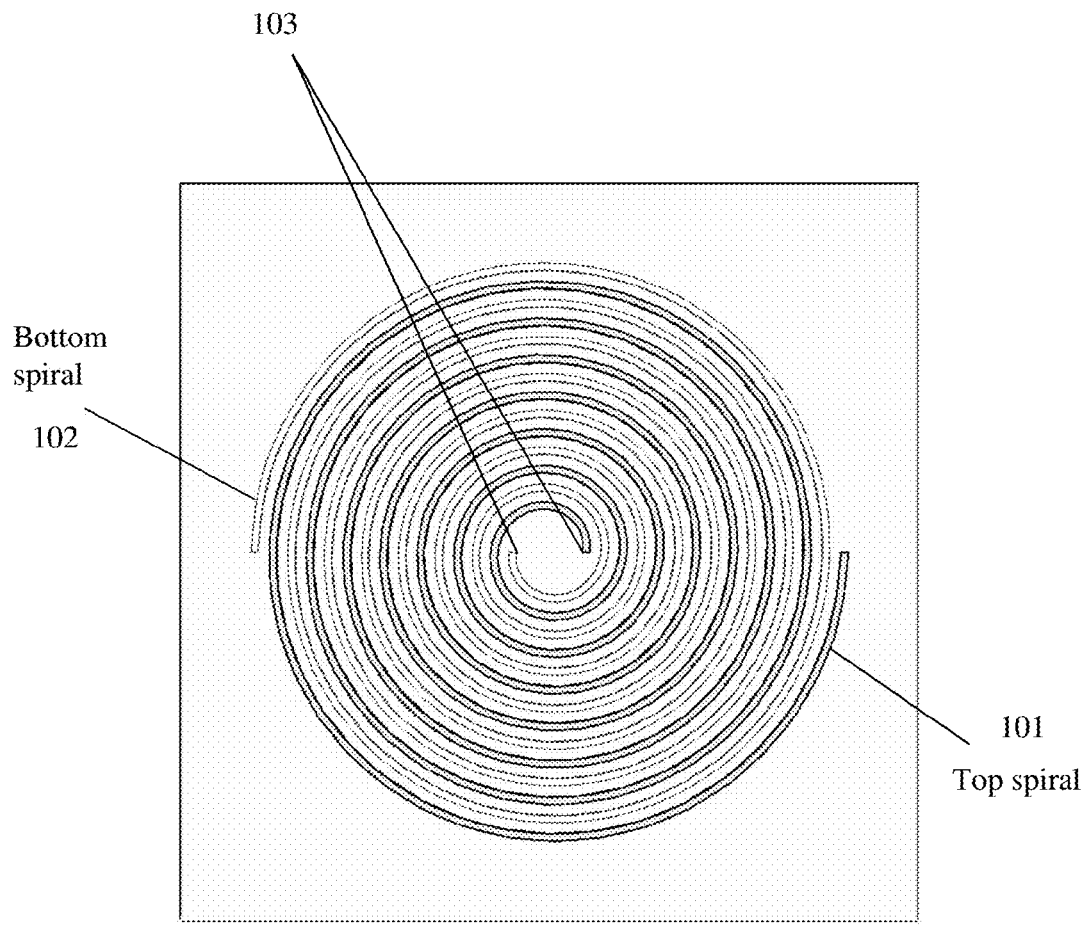
FIG. 10 depicts a horizontal cross section of a spiral capacitor, with an axial angle of 180 degrees, whereby the capacitor plates are at maximum distance to each-other.

This invention discloses a new type of variable coaxial variable capacitor; it is based on a spiral design, whereby a single lengthy conductive strip (band) is wound around a vertical axis in spiral form (FIG. 8) to form one of two blocks. The strip is mounted on a conductive plate which gives access to a signal feed or is grounded. The opposite block is made the same way and both blocks are inserted into each-other inter-digitally to various overlapping depths. This is best shown in cross sections in FIGS. 11 and 12, whereas FIGS. 9 and 10 show a top view of the spirals in two different rotation angles against each-other: FIG. 9 shows what happens when the spires of one block are rotated such as for the conductive plates to quasi make galvanic contact ($\Phi \approx 90°$), whereas FIG. 10 shows the same structures rotated to opposite angles ($\Phi \approx 180°$). In that latter case the capacitance is minimal, but the maximum frequency of operation is maximal (following the maximum self-resonance frequency, equation {6}).

Figure 13:
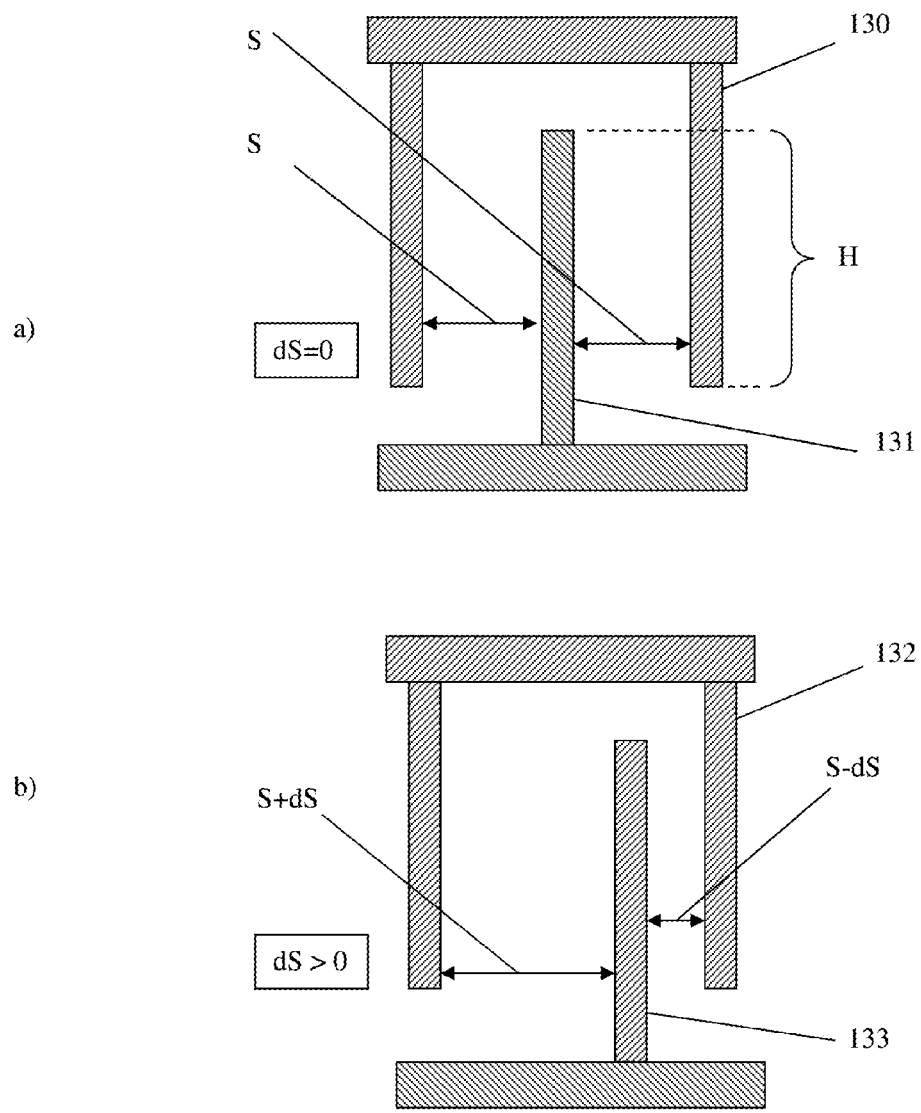
FIG. 13 depicts definitions of gaps between capacitor plates at variable angle settings.

The mathematical relation governing this phenomenon is as follows: The capacitance between two conductive plates can be calculated from $C = \in *A/S$ {3}, whereby $\in = \in_o *\in_r$ is the dielectric constant of the media between the conductive plates ($\in_o$ is the dielectric constant in air or vacuum and $\in_r$ is the dielectric constant of the media, for air=1 for other material >1), A is the surface of the conductive plates facing each-other and S is the width of the gap between the plates. The total capacitance between three conductive plates (FIG. 13) is: $C = C1 + C2$ {4}, whereby $C1 = \in *A/S1$ and $C2 = \in *A/S2$; since $S1 = S - dS$ and $S2 = S + dS$ it follows: $C = \in *A*(1/S1 + 1/S2) = \in *A*2*S/(S^2 - dS^2)$ {5}; or, for $dS = S$ the capacitance goes to infinite (galvanic contact) and for $dS = 0$ (or $\Phi = 180°$) the capacitance goes through a minimum. This is shown in FIG. 15.

Figure 11:
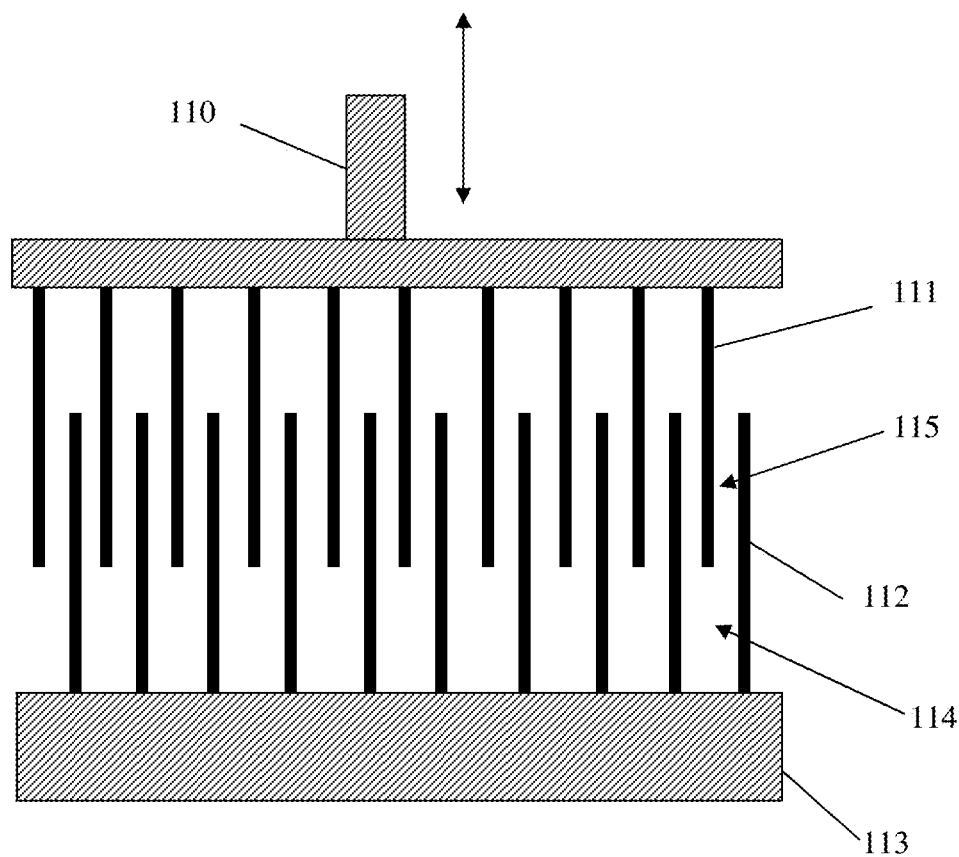
FIG. 11 depicts a vertical cross section of a spiral capacitor at an axial angle of 180 degrees.
Figure 12:
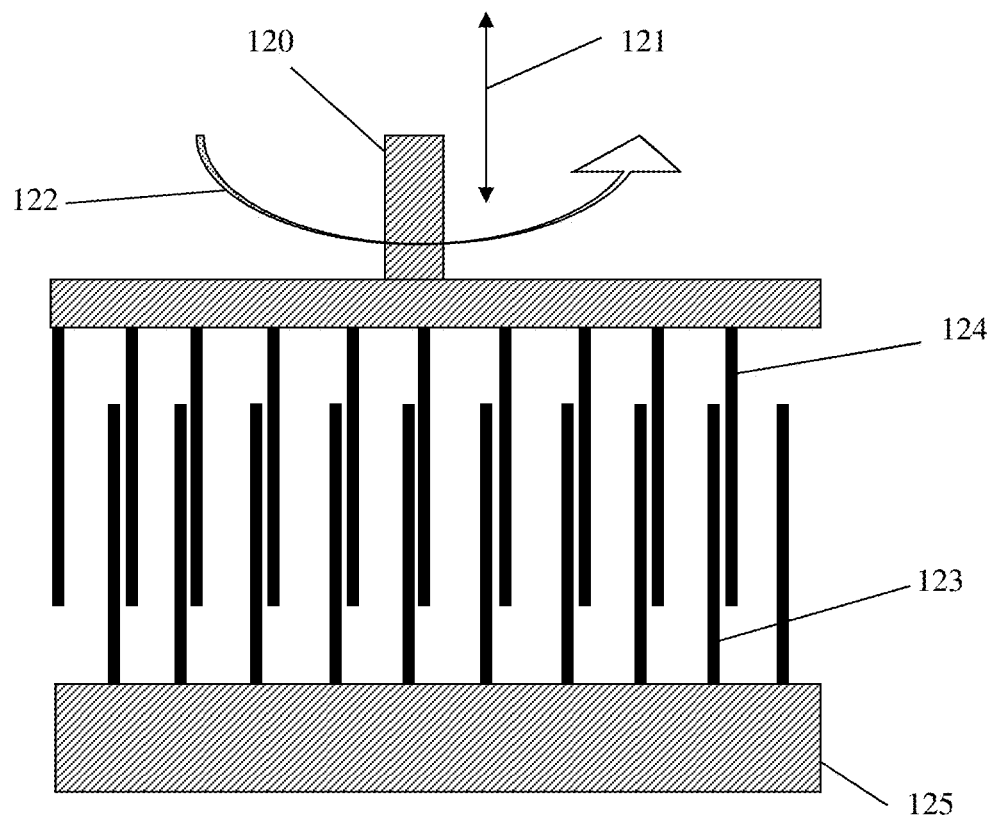
FIG. 12 depicts a vertical cross section of a spiral capacitor at an axial angle of close to 90 degrees.
Figure 15:
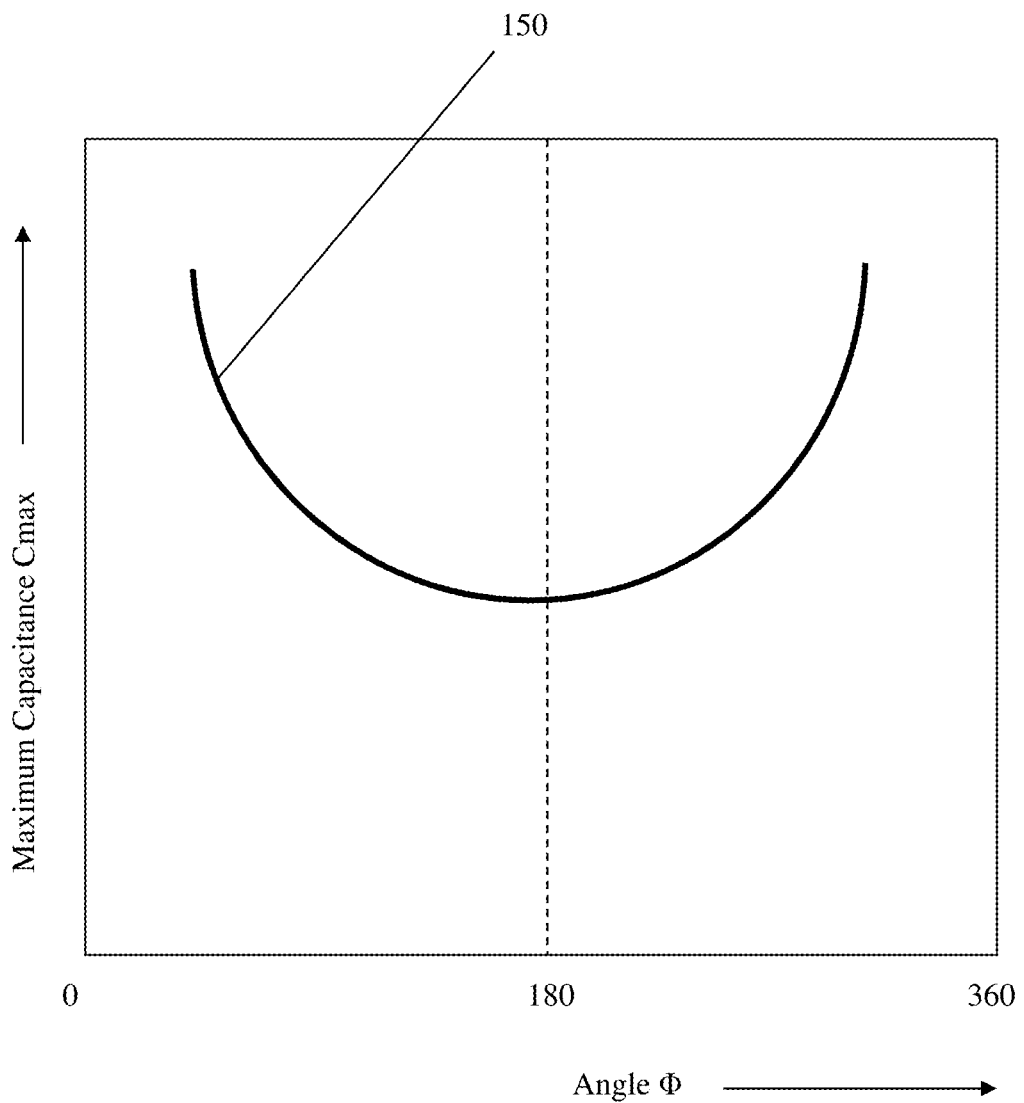
FIG. 15 depicts the value of the maximum capacitance as a function of axial angle.

The spiral capacitors disclosed here offer the possibility of adjusting the maximum Capacitance Cmax by rotating the top block versus the bottom block around the common axis (FIGS. 11, 12 and 15). By doing so the air gap between the adjacent capacitor plates (111, 112) and (123, 124) varies between a maximum value equal to half the pitch of the spiral (114) and zero, whereby at zero we have a galvanic contact and the capacitance becomes useless. The self-resonance of such a capacitor is created by the capacitance and a (parasitic) series inductor created by the wire leads to the capacitor, represented in general by an inductance (L). The relation to calculate this resonance frequency is: $Fr = 1/(2\pi*\sqrt{LC})$ {6}. It is immediately clear, from equations {5} and {6}, that, for constant L, the self-resonance frequency Fr decreases hyperbolically with decreasing the gap S between the conductive plates (115), which corresponds to increasing C in equation {6}. Assuming that the wire-leads (L) do not the change much as we rotate the top (101) and bottom (102) blocks against each-other, then by simply rotating the blocks we can adjust the self-resonance frequency; it is to be noted that when the operation frequency approaches or exceeds the resonance frequency the capacitor becomes inductive and therefore useless.

Figure 14:
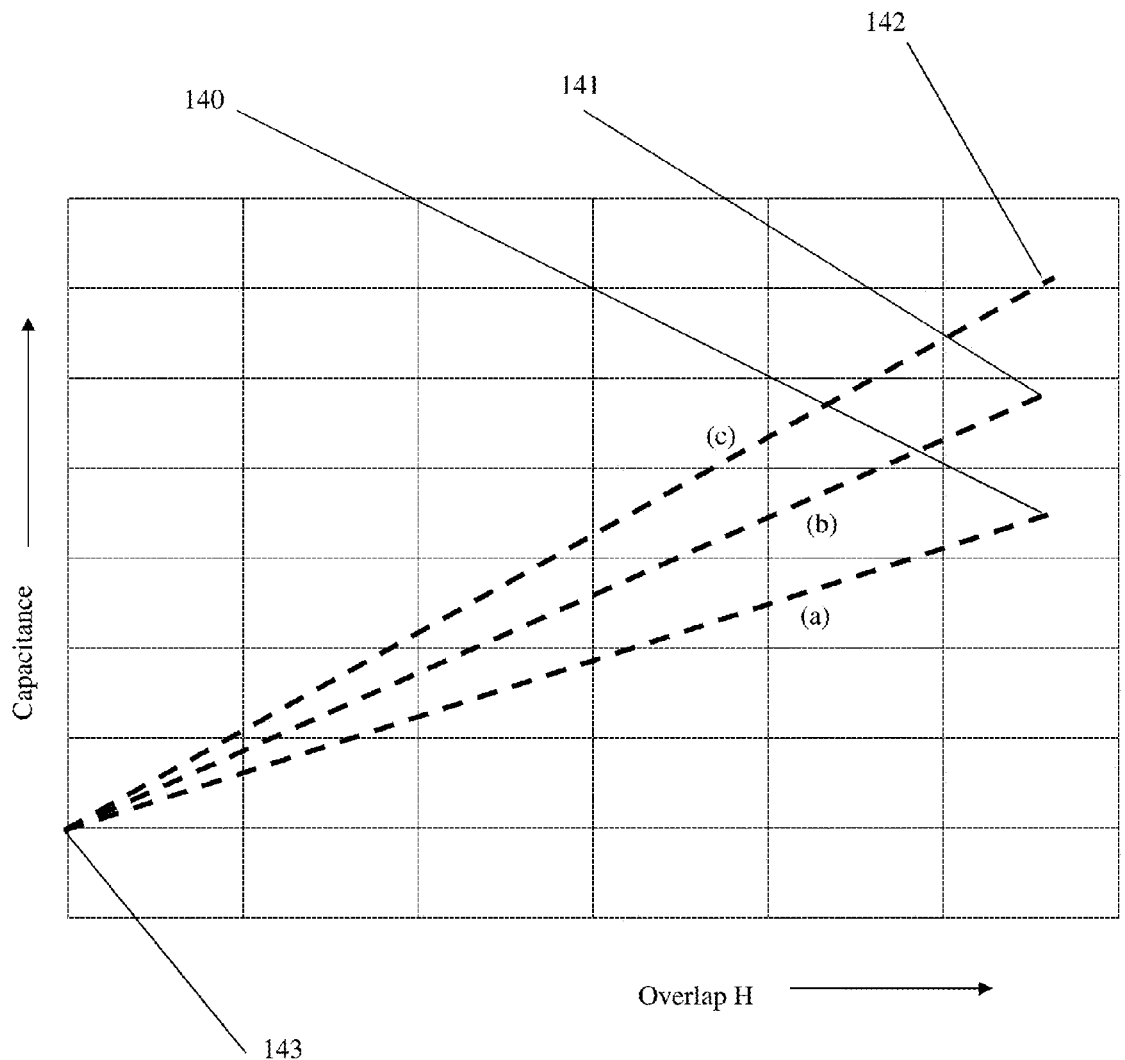
FIG. 14 depicts the effect of block penetration (H) and axial rotation angle Φ on overall capacitance.

The overall capacitance dependence of both, the vertical penetration depth H (overlapping) between the two blocks (FIG. 13(a)) and the rotation angle $\Phi$ (93, 122) is shown in FIG. 14, for three different angles $\Phi$ (a), (b) and (c), whereby (a) corresponds to $\Phi$=180 degrees and (c) to an angle $\Phi$ as small as the structure allows, before the two blocks make galvanic contact. It is clear, when the vertical block overlapping (H) is zero, the overall capacitance is the fringe capacitance through signal leakage in the air due to the physical proximity of the two blocks; with increasing overlapping (H) the capacitance increases linearly, because the overlapping surface between the two plates A is directly proportional to H (see equation {3}) and reaches maximum values for total overlapping (140, 141, 142); as can be seen from equation {5} these maximum values depend on the displacing (dS) of the conductive plates relative to the geometrical center (FIG. 13b), which occurs when the blocks are rotated against each-other.

Together with the maximum capacitance Cmax the gap adjustment between the two conductive plates also affects the corona breakdown voltage of the capacitor. This is important for high power applications. For a given potential difference (Voltage) between the two capacitor plates, the electric field is inverse proportional to the gap width S: $\in_r *E = V/S$ {7}, whereby V is the voltage between the two capacitor plates. The typical corona breakdown field in air is $Emax \approx 3$ V/µm=Vmax/S {8}, (see ref. 8). We therefore have a number of countering phenomena occurring in the spiral capacitors: By changing the rotational angle between the spiral blocks (to reduce the gap between the plates):

(a) we increase the maximum capacitance Cmax,
(b) we reduce the breakdown voltage Vmax and
(c) we reduce the maximum frequency of operation Fmax.

In fact this type of capacitor offers an inherent way of adjusting opposing requirements to an acceptable compromise between contradicting properties like (i) RF power, (ii) maximum capacitance and (iii) maximum frequency of operation, by just rotating the spiral plates and without any major physical modification.

Spiral capacitors can be made for very low and very high frequencies. It all depends on the physical size and the fringe elements (lead inductors and residual capacitance).

Figure 18:
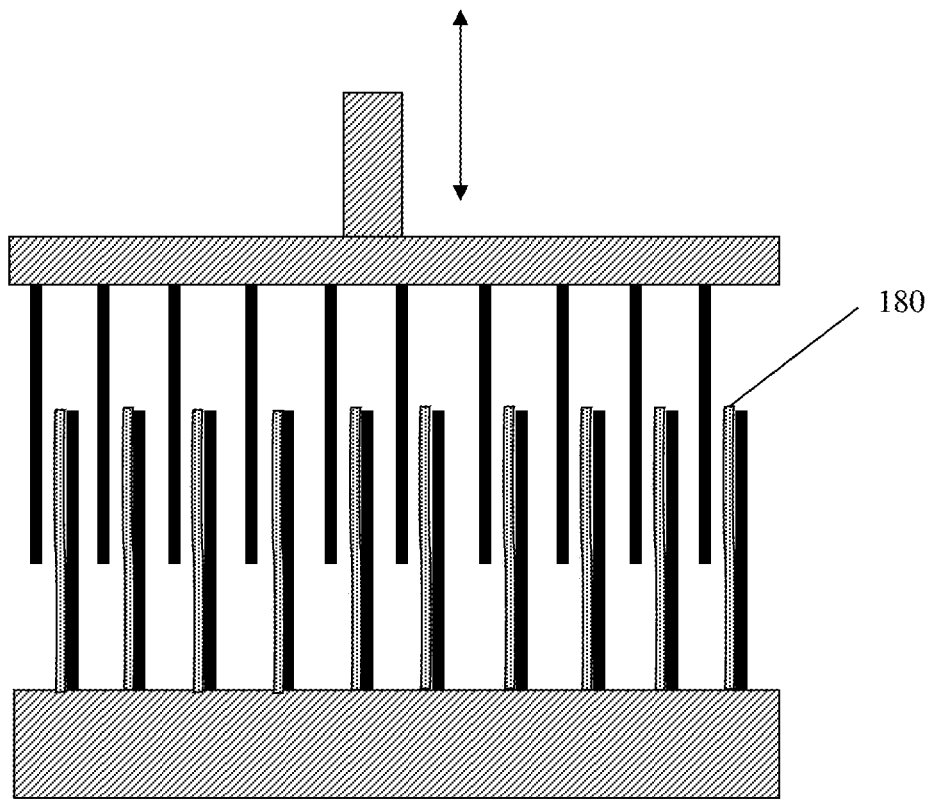
FIG. 18 depicts a vertical cross section of spiral capacitor with dielectric sheet on one spiral stripe.
Figure 19:
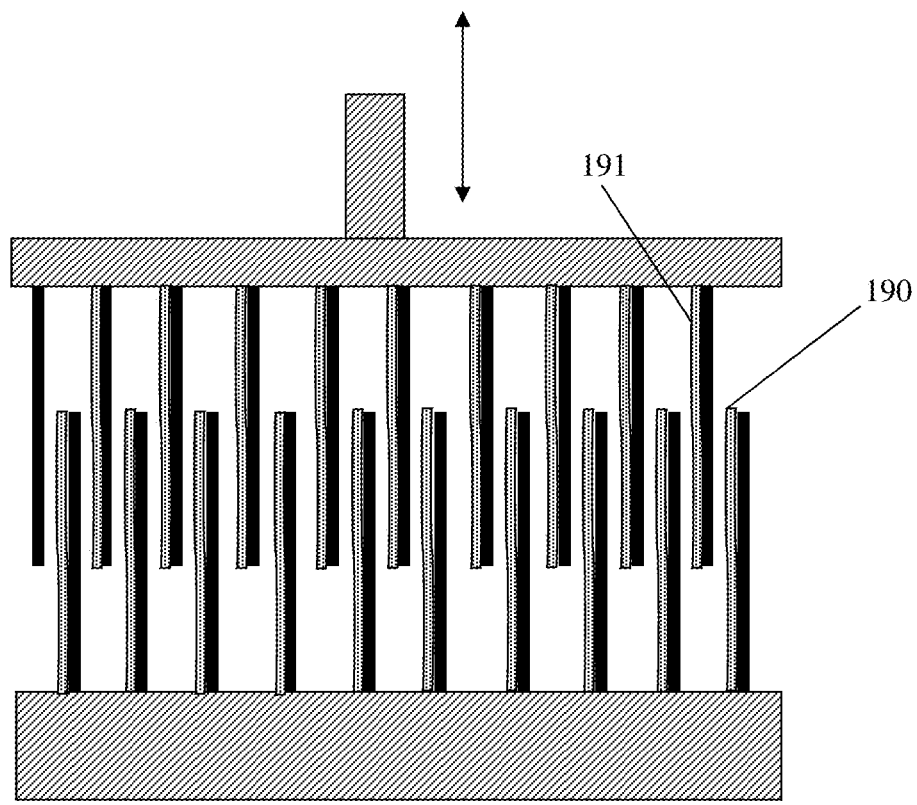
FIG. 19 depicts a vertical cross section of spiral capacitor with dielectric sheet on both spiral stripes.

The gap between the spiralling plates can be left empty, or can be filled, partly or totally, either on one side (FIG. 18) or both sides (FIG. 19) of the moving or static conductive strips with dielectric sheet material. The dielectric sheet filling has three advantages: (a) it increases the maximum capacitance Cmax since it has a dielectric constant $\in_r > 1$ (see equation {3}), (b) it reduces the risk of accidental galvanic contact and (c) it increases the breakdown voltage (since a dielectric in fact reduces the electric field). On the other hand the residual capacitance is increased and the self-resonance frequency is decreased. A practical problem with a loose dielectric sheet between facing plates may occur when the plates first engage, and the edge of the dielectric sheet may tangle with the descending spiral. In that case it is better to have the dielectric sheet attached firmly (glued) to one of the spiral conductive sheets.

Figure 20:
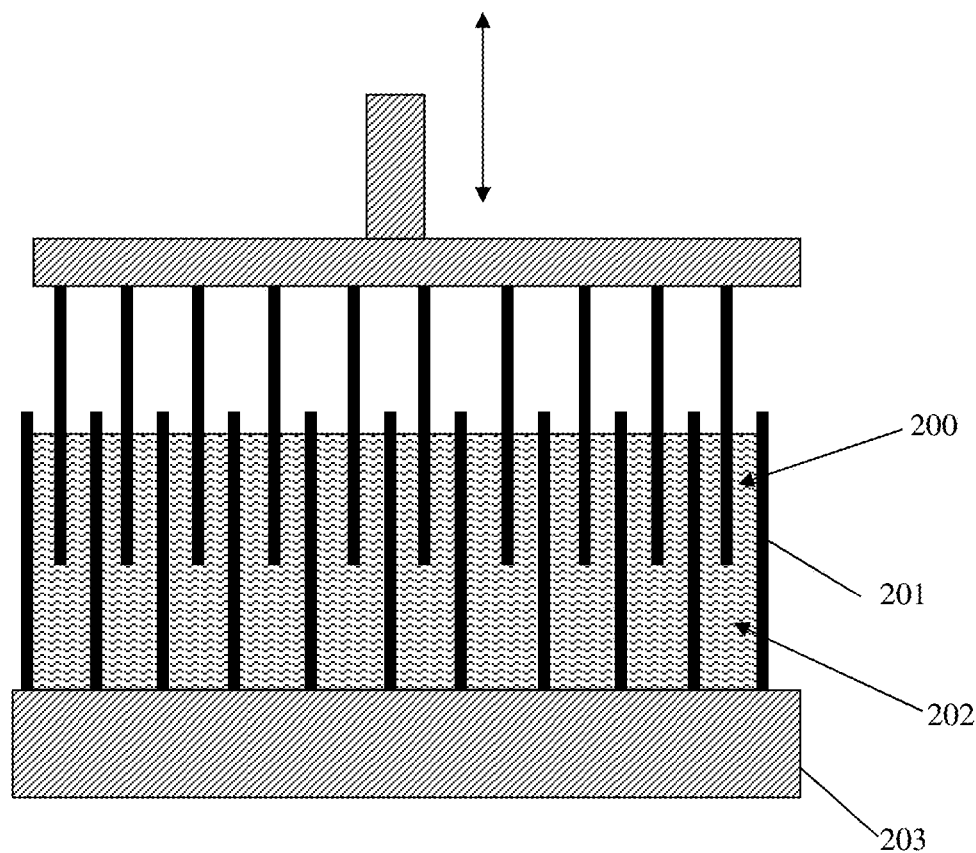
FIG. 20 depicts a vertical cross section of spiral capacitor with the bottom block filled with dielectric low loss fluid.

Instead of loose or attached dielectric sheets, the capacitor gap (200), in fact the whole bottom block (201-203), can be filled fully or partly with low loss dielectric fluid material, such as mineral oil (FIG. 20). In that case the end of the last spiral round of the bottom block must be sealed. Such dielectric fluid (202) has dielectric constant varying typically between 2 and 8 (see ref. 7) and magnifies all advantages and shortcomings of a dielectric sheet mentioned before, such as increasing the maximum capacitance and breakdown voltage but reducing the resonance frequency.

Figure 21:
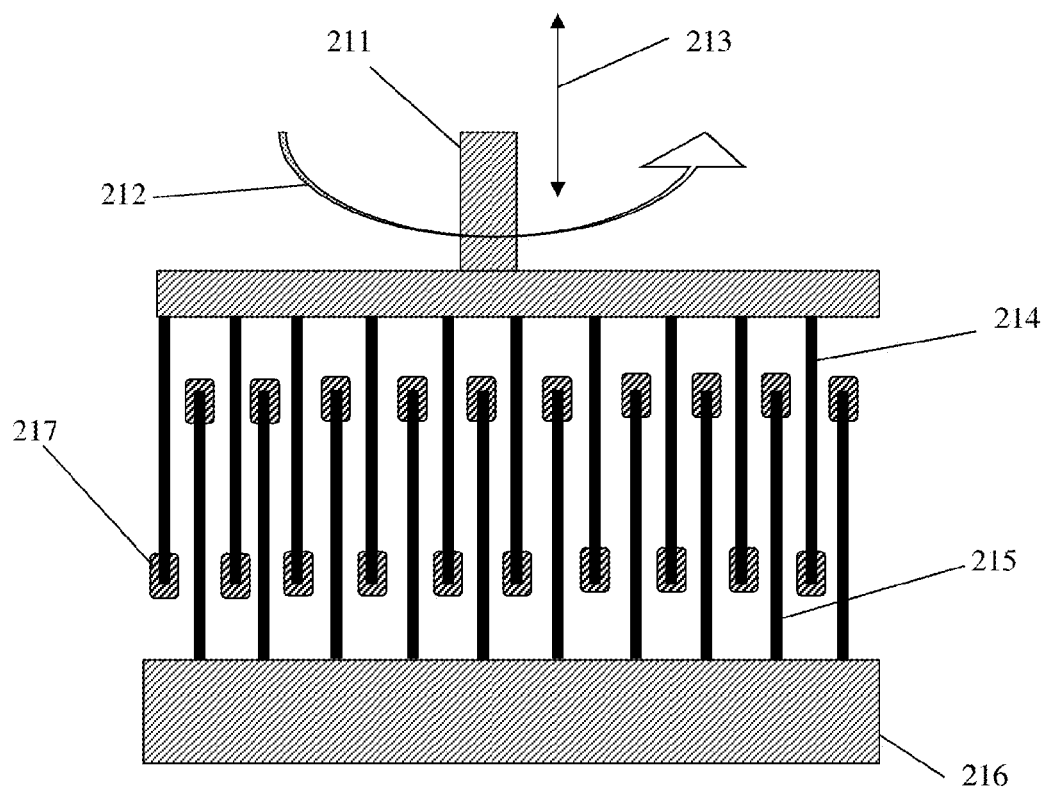
FIG. 21 depicts a spiral capacitor with dielectric protection of the edge of the conductive spiral shim (cross section)

Another embodiment for protecting the capacitor plates from touching and creating galvanic contact is shown in FIG. 21; in this configuration is would be enough to plastify or dielectrically coat only the edges (217) of the spiral bands (215) used to make the capacitor plates. This will avoid short circuits when the plates are rotated (212). Otherwise this embodiment works as before, only that the maximum capacitance Cmax is limited by the thickness of the protection covers (217), but the maximum voltage (power) and frequency are preserved.

Figure 1:
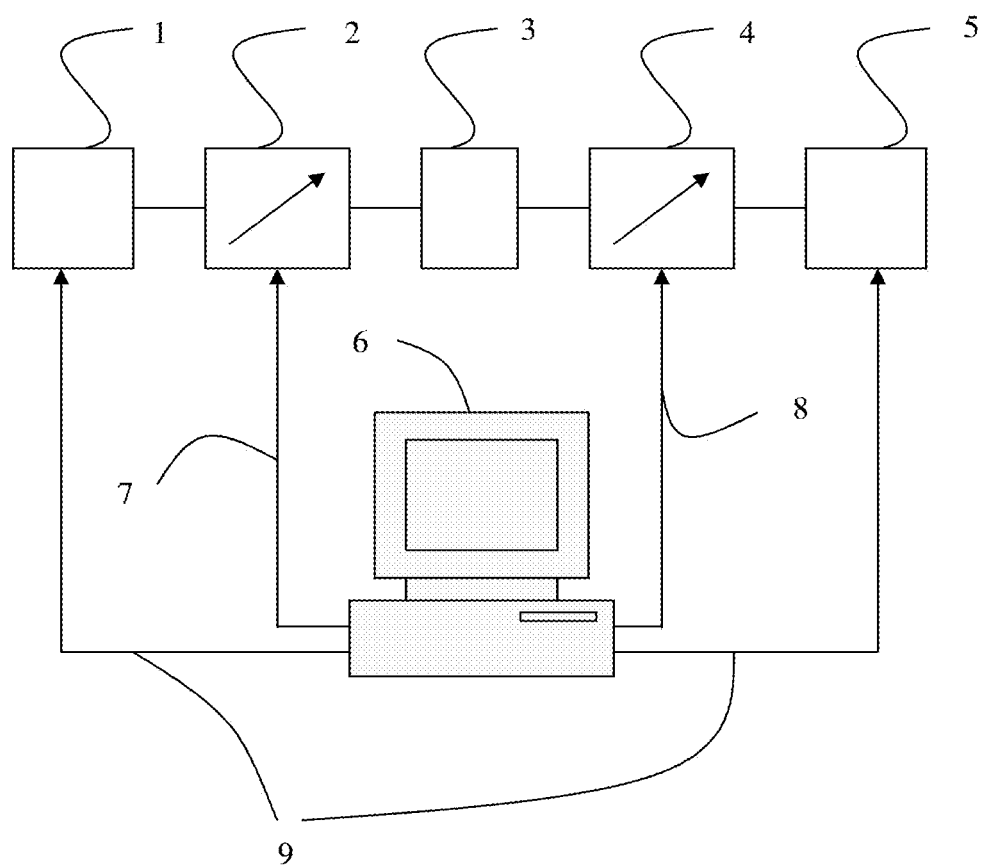
FIG. 1 depicts prior art: a typical automated transistor load pull test system.
Figure 2:
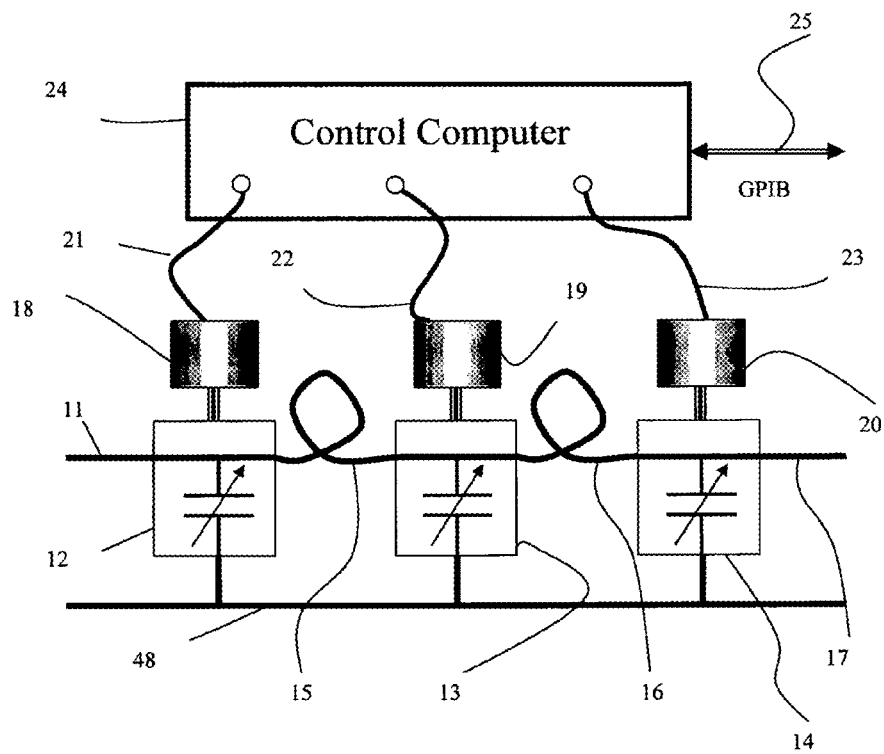
FIG. 2 depicts prior art: the concept of a three capacitor programmable impedance tuner.
Figure 3:
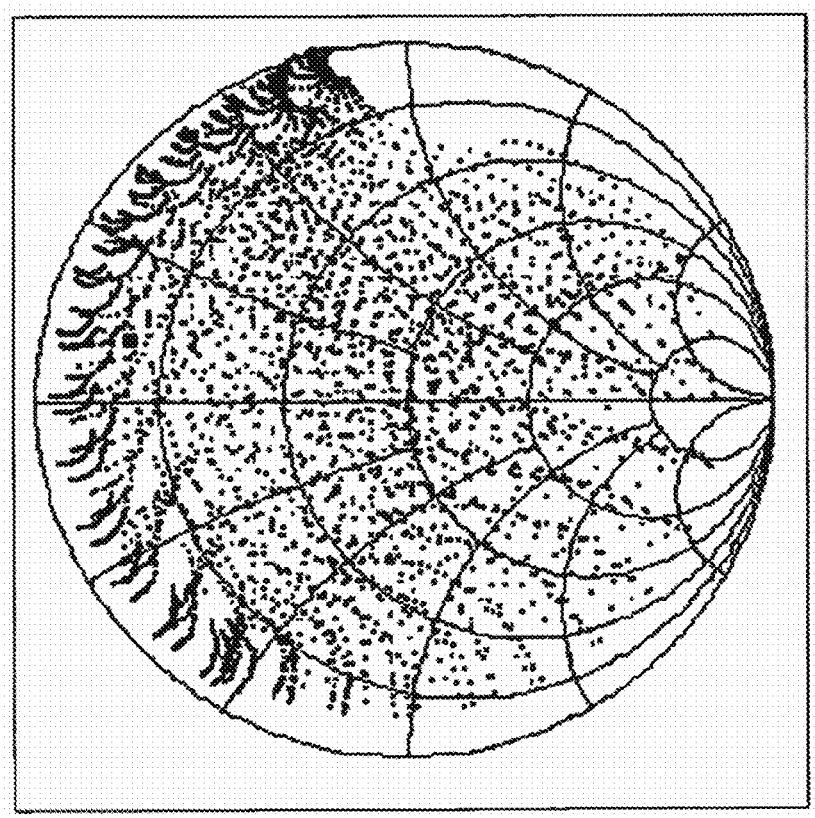
FIG. 3 depicts prior art: tuning points of three-capacitor (stage) low frequency tuner in a frequency range where the tuner operates best.
Figure 4:
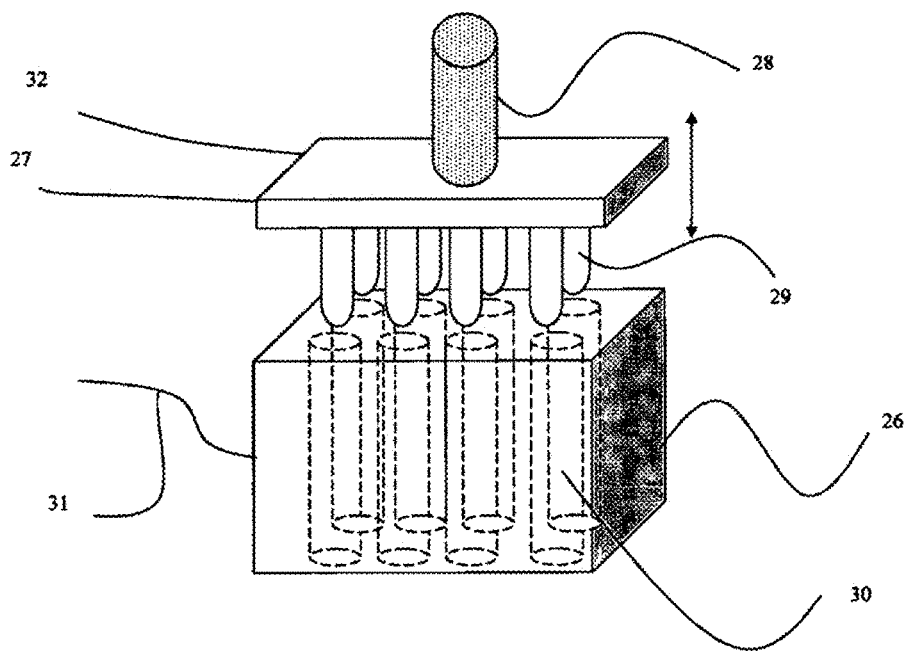
FIG. 4 depicts prior art: a perspective view of an adjustable "stub" capacitor.
Figure 5:
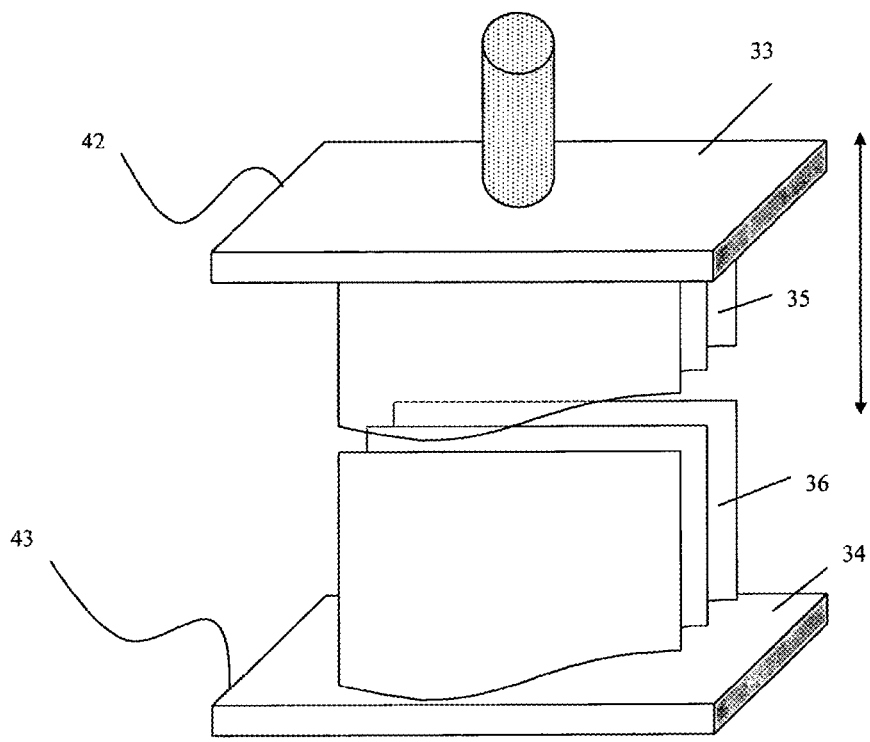
FIG. 5 depicts prior art: a perspective view of a parallel plate adjustable capacitor.
Figure 6:
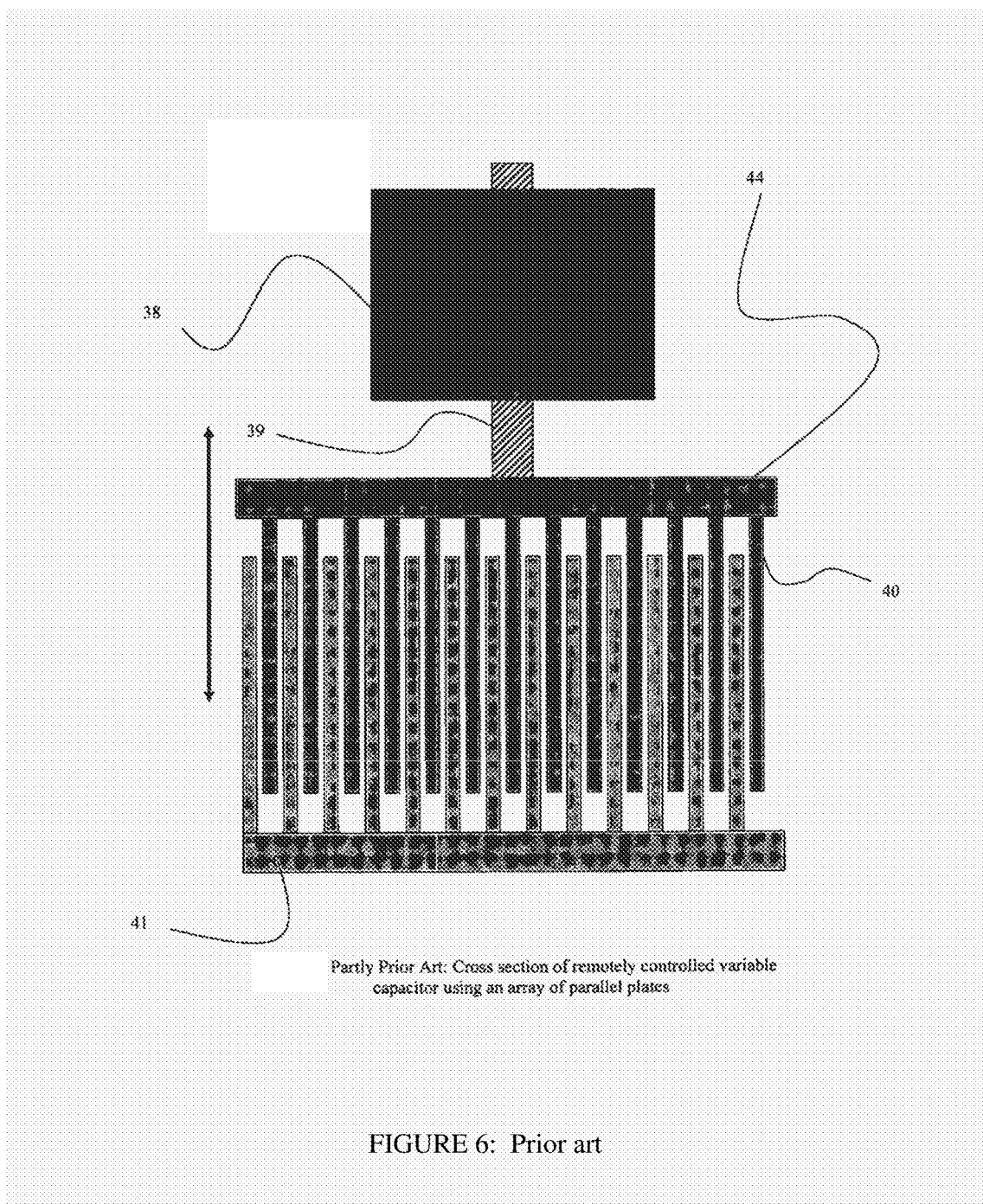
FIG. 6 depicts prior art: a cross block of a parallel plate adjustable capacitor.
Figure 7:
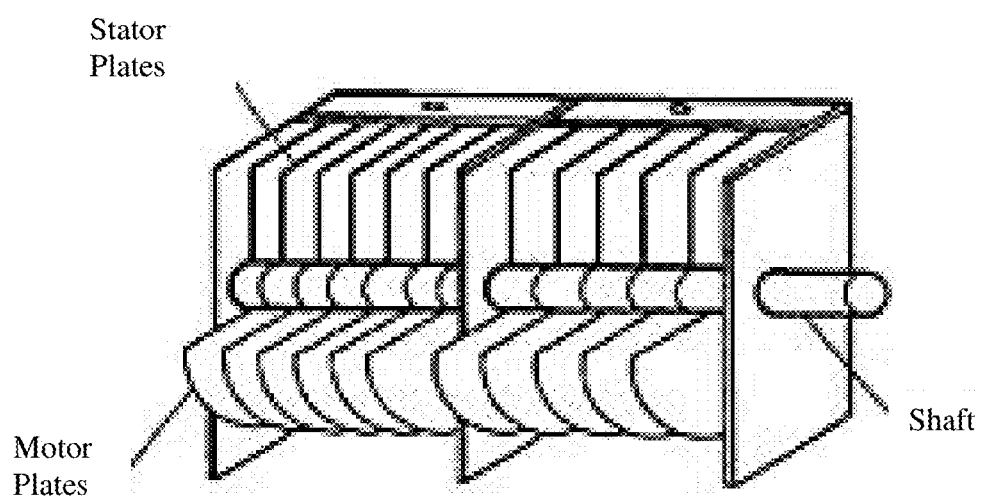
FIG. 7 depicts prior art: a commercially available parallel plate rotary capacitor.
Figure 16:
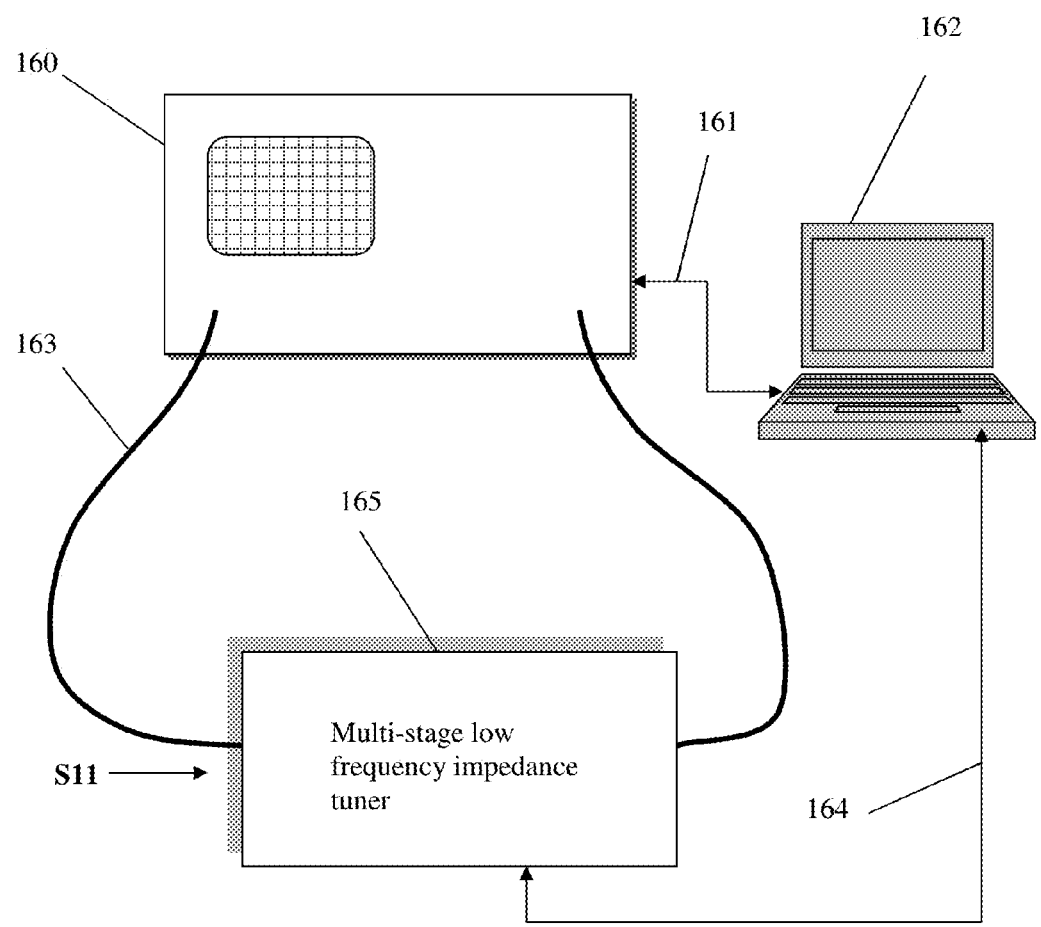
FIG. 16 depicts prior art: a tuner calibration setup.
Figure 17:
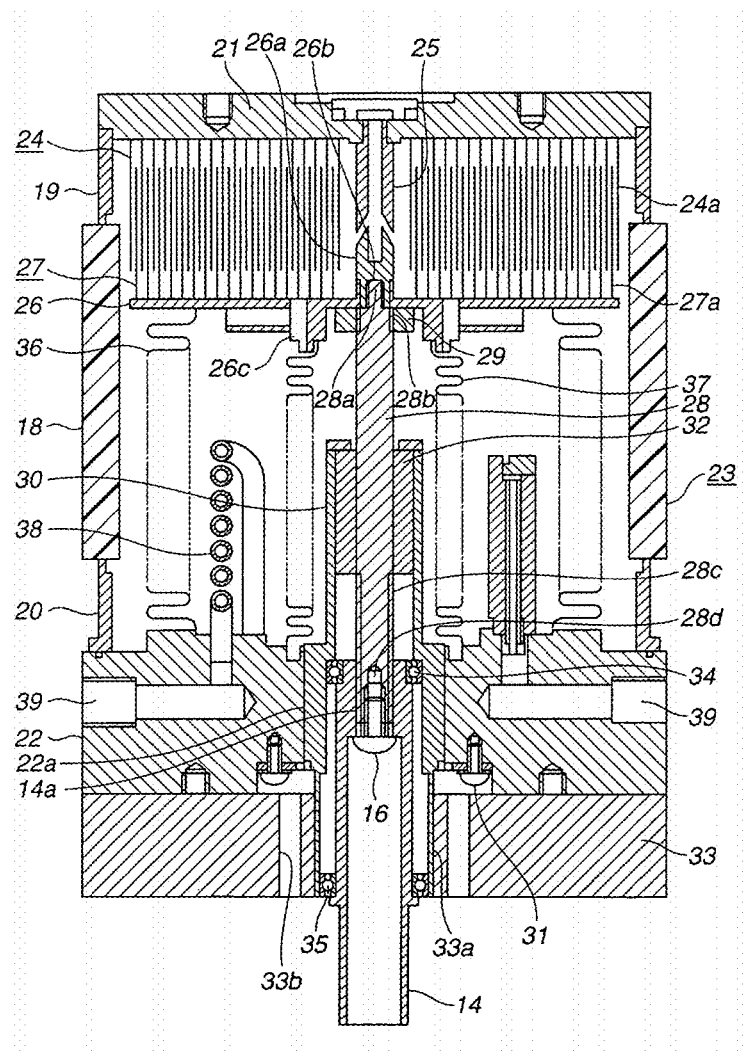
FIG. 17 depicts prior art: cross section of vacuum capacitor: U.S. Pat. No. 6,975,499.

Spiral capacitors can be used in making adjustable networks and, in particular, MHz range impedance tuners (see ref. 4). A tuner as in ref. 4 comprises a cascade of a number of tuning blocks, at least three or four; increasing the number of tuning blocks to more than four is possible but creates problems with data handling and management. Each block comprises a variable capacitor and a length of transmission line (cable), FIG. 2. Each capacitor is remotely controlled via appropriate gear and electric stepper motor. The stepper motors are controlled by appropriate electronic driver circuits and the whole is controlled by a processor, such as a PC, with the proper motor control firmware. Beyond that, and in order to be able to generate desired impedances using the tuner, the computer must allow calibrating the tuner at the frequency of interest and use the calibration data to synthesize target impedances. The calibration of a tuner of this kind is made using a setup as shown in FIG. 16. The tuner (165) is connected to a pre-calibrated network analyzer (160) using RF cables (163); the network analyzer (160) is controlled via digital cable (161) by a PC (162) which also controls the capacitances (164). By driving the capacitances to a number of settings and measuring s-parameters of the tuner twoport, the user can generate tuner calibration data files and save them in the PC's memory or hard-disk. Since the number of permutations of the various states of the capacitors can be very high (in particular when a four stage tuner is used—example: 20 capacitor settings will create a permutation number $P=20^4=160,000$) a modified calibration method is used (see ref. 6). This "de-embedding" calibration procedure allows measuring only $P=20*4=80$ tuner states instead of $20^4=160,000$ states. Even in the case of three tuning segments the gain in time is considerable: 60 states instead of 8,000 states.

The calibration algorithm consists of a number of steps after the tuner has been connected to a pre-calibrated vector network analyzer: in step (1) the tuner is initialized, i.e. all capacitors are adjusted to minimum capacitance by withdrawing the top block from the bottom block and totally disengaging the conductive spirals; then s-parameters between the test and idle ports of the tuner are measured at the selected frequency and saved in a init matrix [S00]; (2) in a second step each capacitor is adjusted individually to various top and bottom block penetrations, whereby all other capacitors are initialized (withdrawn top from bottom block) and s-parameters are measured and saved in capacitor X matrices [SXY], whereby X is the index of said capacitor (X=1, 2, 3 . . . ) and Y is the index of the penetration level between top and bottom blocks (Y varies, typically, between 10 and 20) and all matrices [SXY], except for X=1, are de-embedded with the init matrix (cascaded with the inverse matrix $[S00]^{-1}$) and saved; (3) in a third step the s-parameter matrices for all permutations of all capacitor settings [SXY] with $\{XY\}=\{1 \ldots N, Y=1 \ldots M\}$ whereby $N=1, 2, 3 \ldots$ and $M=10, 20, \ldots$ of all capacitors are cascaded in memory and the result of the total number of permutations $P=M^N$ is saved in tuner calibration files for the specific frequency ready for later use.

Obvious alternatives to the presented preferable embodiments of spiral variable low frequency capacitors and associated impedance tuners shall not impede on to the validity of the present invention.

What I claim as my invention is:

1. A variable capacitor comprising two parts in form of cylindrical blocks, a top block and a bottom block, each mounted on a conductive base plate,
    each said block comprising a single conductive strip which is wound in spiral form around a centre axis and is mounted perpendicularly on said conductive base plate,
    said top block spiral being insertable vertically and interdigitally into said bottom block spiral without creating a galvanic contact.

2. A variable capacitor as in claim 1, whereby the pitch of said top and bottom blocks are the same.

3. A variable capacitor as in claim 1, whereby the axial rotation angle between said top and bottom block spirals is adjustable,
    wherein the smallest angle corresponds to maximum capacitance and the opposite angle (180 degrees) corresponds to minimum capacitance.

4. A variable capacitor as in claim 3, whereby the spiralling conductive strips of said top and bottom blocks are insertable interdigitally into each other to various overlapping depths.

5. A variable capacitor as in claim 4, whereby the space between the spiralling conductive strips of said top and bottom blocks is free of dielectric material.

6. A variable capacitor as in claim 4, whereby a sheet of dielectric material is inserted in the space between the spiralling conductive strips of said top and bottom blocks.

7. A variable capacitor as in claim 4, whereby two dielectric strips are inserted in the space between the spiralling conductive strips facing each-other one on each side of each conductive strip.

8. A variable capacitor as in claim 4, whereby the static (bottom) block is filled partly with dielectric fluid.

9. A variable capacitor as in claim 4, whereby the static (bottom) block is filled fully with dielectric fluid.

10. A variable capacitor as in claim 4 whereby the edges of the spiraling conductive strips are dielectrically protected.

11. An impedance tuner comprising a test port and an idle port and a cascade of at least three tuning blocks,
    each said block comprising a variable capacitor as in claim 4 and lengths of low loss coaxial cable,
    said capacitors being mounted in parallel between a floating terminal and a ground terminal,
    wherein said top block of said capacitors is the floating terminal and said bottom block is the ground terminal,
    and wherein said floating terminals are interconnected using said lengths of coaxial cable, and whereby a first floating terminal is the test port and the last floating terminal is the idle port.

12. An impedance tuner comprising a test port and an idle port and a cascade of at least four tuning blocks,
    each said block comprising a variable capacitor as in claim 4 and lengths of low loss coaxial cable,
    said capacitors being mounted in parallel between a floating terminal and a ground terminal,
    wherein said top block of said capacitors is the floating terminal and said bottom block is the ground terminal,
    and wherein said floating terminals are interconnected using said lengths of coaxial cable, and whereby a first floating terminal is the test port and the last floating terminal is the idle port.

13. A tuner as in claim 11 or 12, whereby said variable capacitors are remotely adjustable using electric motors and associated gear and electronic control.

14. A tuner as in claim 11 or 12, whereby said lengths of cable are adjusted for the tuner to create high reflection in a certain frequency band.

15. A tuner as in claim 11 or 12, whereby the relative angle between said top and bottom blocks of said variable capacitors is adjusted in order to shift the tuning frequency range.

16. A tuner calibration method for tuners as in claim 11 or 12, whereby said tuner is connected to a pre-calibrated vector network analyzer (VNA) and a control computer, in three steps,
    a) in a first step said tuner is initialized (all capacitors adjusted to minimum capacitance by withdrawing said top block from said bottom capacitor block) and s-parameters between the test and idle ports are measured at the selected frequency and saved in a matrix [S00];
b) in a second step each capacitor individually is adjusted to various top and bottom block penetrations, whereby all other capacitors are initialized (top block withdrawn from bottom block) and s-parameters are measured and saved in matrices [SXY], whereby X is the index of said capacitor (X=1, 2, 3 ... N) and Y is the penetration index between top and bottom blocks (Y=1, 2, 3, 4 ... M), and all matrices [SXY], except for X=1, are de-embedded (cascaded with the inverse matrix [S00$^{-1}$]);
c) in a third step all de-embedded s-parameter matrices [SXY] for all permutations (P) of all capacitor settings of all capacitors (P=M$^N$) are cascaded in computer memory and the result is saved in tuner calibration file for later use.

* * * * *